United States Patent
Arima et al.

(10) Patent No.: US 7,825,198 B2
(45) Date of Patent: Nov. 2, 2010

(54) THERMOSETTING RESIN COMPOSITION AND MULTILAYER PRINTED WIRING BOARD USING THE SAME

(75) Inventors: Masao Arima, Hiki-gun (JP); Makoto Hayashi, Hiki-gun (JP); Koshin Nakai, Hiki-gun (JP)

(73) Assignee: Taiyo Ink Mfg. Co., Ltd., Tokyo (JP)

( * ) Notice: Subject to any disclaimer, the term of this patent is extended or adjusted under 35 U.S.C. 154(b) by 0 days.

(21) Appl. No.: 11/525,019

(22) Filed: Sep. 22, 2006

(65) Prior Publication Data
US 2007/0015872 A1   Jan. 18, 2007

Related U.S. Application Data

(63) Continuation of application No. PCT/JP2005/006164, filed on Mar. 30, 2005.

(30) Foreign Application Priority Data
Mar. 30, 2004   (JP) ............................ 2004-100866

(51) Int. Cl.
| | |
|---|---|
| C08G 59/14 | (2006.01) |
| C08G 63/91 | (2006.01) |
| C08G 59/40 | (2006.01) |
| C08G 59/42 | (2006.01) |
| C08G 65/00 | (2006.01) |
| C08G 59/00 | (2006.01) |
| C08G 63/00 | (2006.01) |
| C08L 67/00 | (2006.01) |

(52) U.S. Cl. .................... 525/533; 525/418; 528/112; 528/365

(58) Field of Classification Search .................. 528/86, 528/112, 365; 525/92 F, 533, 418
See application file for complete search history.

(56) References Cited

U.S. PATENT DOCUMENTS

| | | | | |
|---|---|---|---|---|
| 3,968,084 | A * | 7/1976 | Yukuta et al. .................. 528/93 |
| 5,082,883 | A * | 1/1992 | Alexandrovich et al. .... 524/109 |
| 5,401,604 | A * | 3/1995 | Otsuka et al. ................ 430/190 |
| 5,461,112 | A * | 10/1995 | Masse et al. ............... 525/92 B |
| 5,512,632 | A * | 4/1996 | Serini et al. .................... 525/67 |
| 5,910,548 | A * | 6/1999 | Murata et al. ................ 525/438 |
| 5,916,933 | A * | 6/1999 | Johnson et al. .............. 523/208 |
| 5,948,514 | A * | 9/1999 | Komori et al. ............... 428/209 |
| 5,965,245 | A * | 10/1999 | Okano et al. ................ 428/209 |
| 6,005,063 | A * | 12/1999 | Van Doorn et al. ............ 528/86 |
| 6,043,333 | A * | 3/2000 | Kuboki et al. ................. 528/98 |
| 6,090,905 | A * | 7/2000 | Juzukonis et al. ............ 528/114 |
| 6,207,230 | B1 * | 3/2001 | Ohya et al. .................. 427/227 |
| 6,805,958 | B2 | 10/2004 | Nakamura et al. |
| 6,964,813 | B2 * | 11/2005 | Hashimoto .................. 428/413 |
| 6,994,888 | B2 * | 2/2006 | Metcalfe .................... 427/372.2 |
| 7,087,702 | B2 * | 8/2006 | Ogura et al. ................. 528/106 |
| 2002/0187353 | A1 * | 12/2002 | Nakamura et al. ........... 428/416 |
| 2003/0068567 | A1 * | 4/2003 | Ono et al. ...................... 430/14 |
| 2003/0130438 | A1 * | 7/2003 | Amagai et al. .............. 525/370 |
| 2003/0149222 | A1 * | 8/2003 | Ichinose et al. ............. 528/170 |
| 2003/0178229 | A1 * | 9/2003 | Toyoda et al. ................ 174/261 |
| 2003/0194562 | A1 * | 10/2003 | Ishii et al. .................... 428/413 |
| 2003/0201548 | A1 * | 10/2003 | Ikezawa et al. .............. 257/793 |
| 2004/0094751 | A1 * | 5/2004 | Ogiwara ..................... 252/500 |
| 2006/0167189 | A1 * | 7/2006 | Mizuno et al. .............. 525/396 |

FOREIGN PATENT DOCUMENTS

| | | |
|---|---|---|
| CN | 1293218 A | 5/2001 |
| CN | 1435448 A | 8/2003 |
| EP | 995765 A1 * | 4/2000 |
| JP | 05-140264 A | 6/1993 |
| JP | 07-062086 A | 3/1995 |
| JP | 07-238136 A | 9/1995 |
| JP | 7-304931 | 11/1995 |
| JP | 7-304933 | 11/1995 |
| JP | 11-87927 | 3/1999 |
| JP | 2001-181375 A | 7/2001 |
| JP | 2002-309200 A | 10/2002 |
| JP | 2003-127313 A | 5/2003 |
| JP | 2004099635 A * | 4/2004 |

* cited by examiner

*Primary Examiner*—Mark Eashoo
*Assistant Examiner*—Liam J Heincer
(74) *Attorney, Agent, or Firm*—Oblon, Spivak, McClelland, Maier & Neustadt, L.L.P.

(57) ABSTRACT

A thermosetting resin composition comprising (A) a thermoplastic resin having a structure represented by the following general formula (a) and/or a structure represented by the following general formula (b) in which 5 to 99 mol % of hydroxyl groups of polyhydroxyether are esterified, and (B) a thermosetting resin:

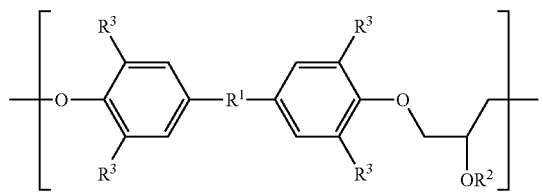

(a)

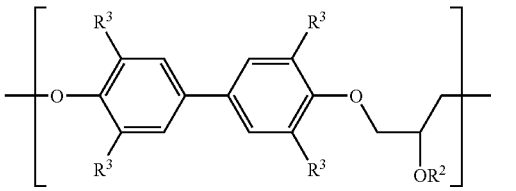

(b)

wherein $R^1$ represents $C_{1-18}$ aliphatic or aromatic-ring-containing alkylene group or $-SO_2-$, 5 to 99 mol % of $R^2$ represent a straight chain or cyclic carbonyl group or aromatic carbonyl group having 1 to 20 carbon atoms, the residue 95 to 1 mol % represent a hydrogen atom, and $R^3$ represents a hydrogen atom or a methyl group, with a proviso that a plurality of $R^3$'s may be the same or different.

7 Claims, No Drawings

THERMOSETTING RESIN COMPOSITION AND MULTILAYER PRINTED WIRING BOARD USING THE SAME

CROSS-REFERENCE TO RELATED APPLICATIONS

This is a Continuation Application of PCT Application No. PCT/JP2005/006164, filed Mar. 30, 2005, which was published under PCT Article 21(2) in Japanese.

This application is based upon and claims the benefit of priority from prior Japanese Patent Application No. 2004-100866, filed Mar. 30, 2004, the entire contents of which are incorporated herein by reference.

BACKGROUND OF THE INVENTION

1. Field of the Invention

The present invention relates to a thermosetting resin composition for an interlayer insulating material having low water absorption, a low dielectric constant and low dielectric dissipation factor, and excellent adhesion to a substrate and a conductor in a build-up type multilayer printed wiring board in which conductor circuit layers and insulation layers are alternately accumulated, and to a multilayer printed wiring board using the same.

2. Description of the Related Art

Attention has recently been directed to a build-up type manufacture technique in which an organic insulating layer and a conductor layer are alternately accumulated on a conductor layer of an inner layer circuit board as a method of manufacturing the multilayer printed wiring board. For example, a method of manufacturing a multilayer printed wiring board has been proposed, in which after an epoxy resin composition is applied to an inner layer circuit board having a circuit formed thereon, heated and cured, an uneven roughened surface is formed on the surface of the obtained insulating layer by a roughening agent, and subsequently, a conductor layer is formed by plating (refer to, for example, Jpn. Pat. Appln. KOKAI Publication Nos. 7-304931 [claims] and 7-304933 [claims]).

A method of manufacturing a multilayer printed wiring board has been proposed, in which after an epoxy resin adhesion sheet is laminated on an inner layer circuit board having a circuit formed thereon, heated and cured, an uneven roughened surface is formed on the surface of the obtained insulating layer by a roughening agent, and subsequently, a conductor layer is formed by plating (refer to, for example, Jpn. Pat. Appln. KOKAI Publication No. 11-87927 [claims]).

However, these manufacturing methods form the roughened surface using the roughening agent, and form the conductor layer using the plating. None of the inventions refers to the water absorption, dielectric constant or dielectric dissipation factor essential for the high density and high speed of the latest electronic equipment. Moreover, the obtained insulating layer has actually high water absorption, and a comparatively high dielectric constant and dielectric dissipation factor.

On the other hand, a process for forming the roughened surface on the surface of the insulating layer described above to form the conductor layer by electroless plating adopts the following process. That is, the whole surface of the cured insulating layer is generally swelled by an organic solvent such as N-methyl-2-pyrrolidone, N,N-dimethylformamide and methoxypropanol, and an alkaline aqueous solution or the like such as caustic soda and caustic potash. Subsequently, the surface is roughened by using an oxidizer such as a dichromate, a potassium permanganate, ozone, hydrogen peroxide/sulfuric acid or nitric acid. Then, the surface is immersed in an aqueous solution containing a catalyst for plating to adsorb the catalyst to the surface, and is immersed in a plating liquid in which metal is solubilized to deposit the plating.

However, since most chemicals to be used exist in the state of an aqueous solution in the process, a sufficient roughened shape is not obtained after all when the hydrophobicity of the insulating layer is increased. As a result, there have been problems in that the adhesion and contact of conductor plating are not obtained.

BRIEF SUMMARY OF THE INVENTION

It is an object of the present invention to provide a thermosetting resin composition capable of forming a conductor layer having excellent adhesion without worsening water absorption, dielectric constant or dielectric dissipation factor of an insulating layer in a build-up type multilayer printed wiring board in which conductor circuit layers and insulation layers are alternately accumulated, and a build-up type multilayer printed wiring board using the same.

The present inventors have conducted earnest studies in order to realize the above object. As a result, the invention summarized below has been accomplished as a thermosetting resin composition capable of forming a conductor layer having excellent adhesion without worsening the water absorption, dielectric constant or dielectric dissipation factor of the insulating layer.

That is, a thermosetting resin composition of the present invention contains (A) a thermoplastic resin having a structure represented by the following general formula (a) and/or a structure represented by the following general formula (b) in which 5 to 99 mol % of hydroxyl groups of polyhydroxyether are esterified, and (B) a thermosetting resin:

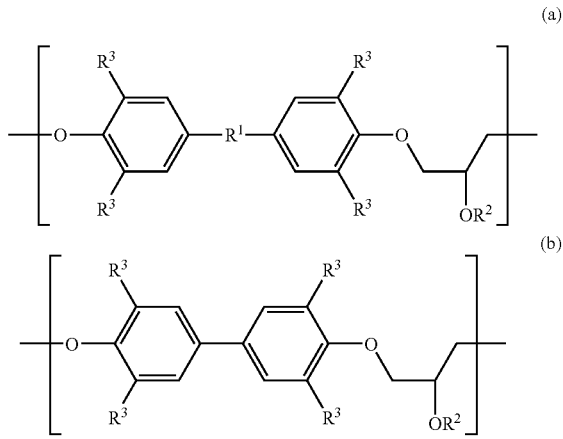

wherein $R^1$ represents $C_{1-18}$ aliphatic or aromatic-ring-containing alkylene group or $-SO_2-$, 5 to 99 mol % of $R^2$ represent a straight chain or cyclic carbonyl group or aromatic carbonyl group having 1 to 20 carbon atoms, the residue 95 to 1 mol % represent a hydrogen atom, and $R^3$ represents a hydrogen atom or a methyl group, with a proviso that a plurality of $R^3$'s may be the same or different.

As a preferable aspect, the above thermoplastic resin (A) has at least one structure selected from the group consisting of a bisphenol A structure represented by the following general formula (c), a bisphenol S structure represented by the following general formula (d), a biphenol structure represented by the following general formula (e), and a bixylenol structure represented by the following general formula (f):

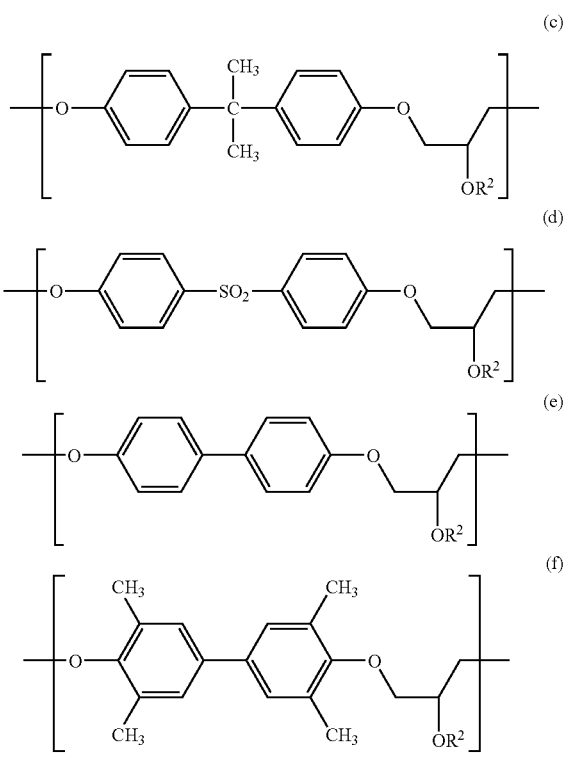

wherein 5 to 99 mol % of $R^2$ represent a straight chain or cyclic carbonyl group or aromatic carbonyl group having 1 to 20 carbon atoms, and the residue 95 to 1 mol % represent a hydrogen atom in the same manner as the above description.

In the other aspect, the above thermosetting resin (B) contains (B-1) an epoxy resin having at least two epoxy groups in one molecule, and at least one epoxy curing agent selected from the group consisting of (B-2) a polyimide resin having a carboxyl group and a linear hydrocarbon structure having a number-average molecular weight of 300 to 6000, (B-3) a polyphenol resin having at least two phenolic hydroxyl groups, and (B-4) imidazole compounds.

Preferably, the epoxy resin (B-1) contains a compound having an epoxy equivalent of 200 or less and a compound having an epoxy equivalent exceeding 200. The polyimide resin (B-2) has a hyperbranched type structure having an isocyanurate ring structure.

It is preferable that the thermosetting resin composition of the present invention further contains an inorganic filler.

The present invention provides a prepreg sheet formed by impregnating a substrate with the above thermosetting resin composition and semi-curing the thermosetting resin composition.

Furthermore, the present invention provides a build-up type multilayer printed wiring board using the above thermosetting resin composition as an insulating layer.

The present invention can provide a multilayer printed wiring board having low water absorption, a low dielectric constant and low dielectric dissipation factor, and excellent adhesion to a substrate and a conductor, and high reliability in which conductor circuit layers and insulation layers are alternately accumulated.

Since the thermosetting resin composition of the present invention has a low dielectric constant and low dielectric dissipation factor, the thickness of an interlayer insulating layer can be reduced, and a space between circuits can be narrowed to make the multilayer printed wiring board lighter and more compact in size.

The thermosetting resin composition of the present invention contains (A) a thermoplastic resin having a structure in which 5 to 99 mol % of hydroxyl groups of polyhydroxyether are esterified and which is represented by the following general formula (a) and/or formula (b), and (B) a thermosetting resin:

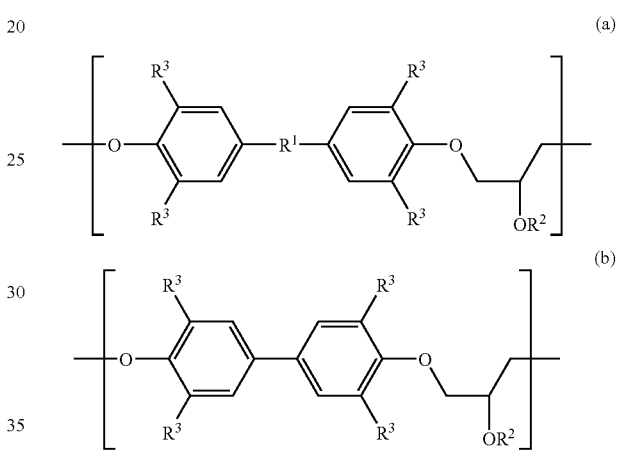

wherein $R^1$ represents $C_{1-18}$ aliphatic or aromatic-ring-containing alkylene group, or —$SO_2$—, 5 to 99 mol % of $R^2$ represent a straight chain or cyclic carbonyl group or aromatic carbonyl group having 1 to 20 carbon atoms, the residue 95 to 1 mol % represent a hydrogen atom, and $R^3$ represents a hydrogen atom or a methyl group, with a proviso that a plurality of R3's may be same or different.

First, the thermoplastic resin (A) constituting the thermosetting resin composition of the invention will be described.

Examples of the thermoplastic resin (A) include resins obtained by esterifying, by using various monobasic acid anhydrides or acid chloride, a hydroxyl group of a hydroxyether part which exists in a skeleton of a phenoxy resin which is a condensate of epichlorohydrin and various bifunctional phenol compounds.

As the above bifunctional phenol compounds, known conventional compounds such as bisphenol A, bisphenol F, bisphenol S, bixylenol and biphenol can be used individually or in combination. However, it is preferable that the thermoplastic resin has at least one structure selected from the group consisting of the bisphenol A structure represented by the following general formula (c), the bisphenol S structure represented by the following general formula (d), the biphenol structure represented by the following general formula (e) and the bixylenol structure represented by the following general formula (f) in view of heat resistance and toughness:

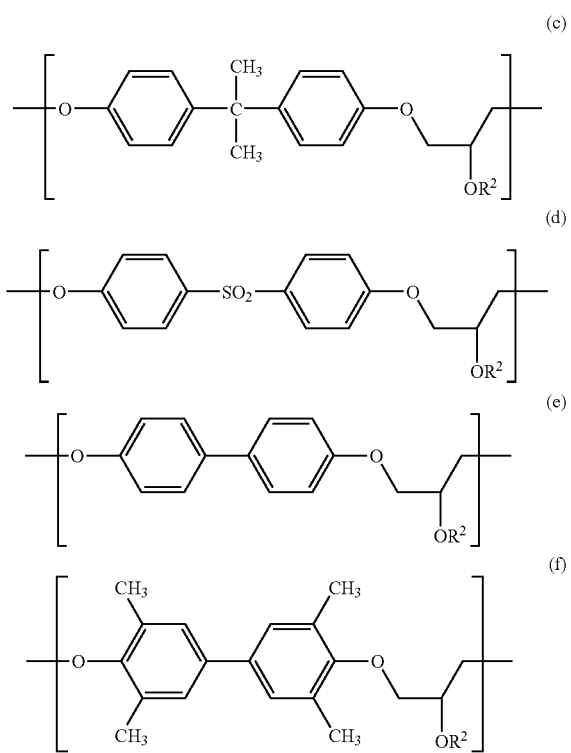

wherein 5 to 99 mol % of $R^2$ represent a straight chain or cyclic carbonyl group or aromatic carbonyl group having 1 to 20 carbon atoms, and the residue 95 to 1 mol % represent a hydrogen atom in the same manner as in the above description.

Bifunctional phenol compounds such as hydroquinone, catechol, resorcin and dinaphthol, or bifunctional alcoholic compounds such as ethylene glycol and diethylene glycol may be partially introduced in addition to the above description.

Examples of the esterified structure of the above thermoplastic resin (A) include structures such as acetoxy, propionyloxy, butyryloxy, isobutyryloxy and benzoyloxy, and structures esterified individually and in combination.

The esterification ratio is 5 to 99 mol %, and more preferably 30 to 99 mol %. When the esterification ratio is less than 5 mol %, an effect for reducing the water absorption and increasing peel strength is few. On the other hand, when the esterification ratio exceeds 99 mol %, the yield in the method is poor, and the esterification ratio is not industrially advantageous.

It is preferable that the weight average molecular weight of the above thermoplastic resin (A) is 5,000 to 100,000. Thereby, an effect for reducing the water absorption exists and flexibility is applied to a dryness coat and a cured coat. Further, crawling at the time of applying and coating can be prevented, and furthermore, viscosity at the time of a heating press can be enhanced, so that resin staining after pressing can be reduced. Particularly, the flexibility becomes more remarkable as the esterification ratio is increased. Herein, when the weight average molecular weight is less than 5000, there is no effect on flexibility, application and coating property. On the other hand, when the weight average molecular weight is more than 100,000, the viscosity of the composition is excessively increased and bubbles are generated in the case of the application and the coating.

The operation of the thermoplastic resin in which 5 to 99 mol % of the hydroxyl group of the polyhydroxyether which is the feature of the present invention are esterified will be described.

First, the thermoplastic resin having the polyhydroxyether structure has a feature in which the thermoplastic resin can be arbitrarily mixed with a varnish of a thermoset resin such as the epoxy resin as compared with common polyester, polyimide resin, polyether and the like. For example, a thermoplastic resin having excellent heat resistance such as wholly aromatic polyester or polyimide resin is often separated in a state of the varnish. On the other hand, although the acrylic resin or the like can be arbitrarily mixed with the epoxy resin comparatively, the acrylic resin has a drawback in which the acrylic resin is weak for solder heat resistance of 288° C. However, the hydroxyether structure has a hydroxyl group having high polarity, and a problem exists in dielectric constant, dielectric dissipation factor and water absorption.

When trying to esterify the hydroxyl group, it has been confirmed that the reduction in water absorption, the reduction in dielectric constant and the reduction in dielectric dissipation factor can be realized and peel strength which is the index of the adhesion with the conductor layer represents a high value. Although the details are not clear, it is believed that the characteristic of the object is attained from the following phenomenon.

(1) Since the hydroxyl group having high polarity is esterified, the water absorption, dielectric constant and dielectric dissipation factor of the cured product are reduced.

(2) In the case of a roughening process, the ester existing on the surface is hydrolyzed by an alkaline swelling liquid and an oxidizer, and the hydroxyl group is reproduced.

(3) Since the hydroxyl group is reproduced on the surface, the roughening due to the oxidizer becomes easy, and the amount of adsorption of a plating catalyst is also sufficient to improve the adhesion with the conductor.

That is, it is believed that hydrophobicity is maintained in the insulating layer, and the surface portion adhered with the conductor expresses the plating attachment and adhesion due to the hydroxyl group to be compatible in the opposite characteristic.

Furthermore, it has become clear that referring to the thermoplastic resin in which 5 to 99 mol % of the hydroxyl groups of the polyhydroxyether structure is esterified and which has the weight average molecular weight of 5000 to 100,000, the dielectric dissipation factor is very stable in a high frequency area as compared with the thermoplastic resin having the corresponding polyhydroxyether structure. It is believed that the freedom degree of the thermoplastic resin existing in the cross-link matrix of thermosetting resin is comparatively large as the reason, and that the polyhydroxyether part tends to cause rotational movement like a crankshaft even in a temperature range not higher than Tg. Therefore, it is considered that when the high-frequency electric field exists, the polyhydroxyether rotates freely and the orientation thereof is easily polarized. On the other hand, it is considered that the orientation polarization is blocked by the steric exclusion of one in which the polyhydroxyether part is esterified, and the dielectric dissipation factor is stable.

Next, the thermosetting resin (B) constituting the thermosetting resin composition will be described.

Examples of the thermosetting resin (B) include an epoxy resin system, an acrylic resin system, a polyimide resin system, a polyamideimide resin system, a polyphenol resin system, a polycyanate resin system, a polyester resin system, and a thermosetting type polyphenylen ether resin system. At least two kinds thereof can be used in combination. Of these, a thermosetting resin (B) containing (B-1) an epoxy resin having at least two epoxy groups in one molecule, and at least one epoxy curing agent selected from the group consisting of (B-2) a polyimide resin having a carboxyl group and a linear hydrocarbon structure having a number-average molecular weight of 300 to 6000, (B-3) a phenol resin having at least two phenolic hydroxyl groups, and (B-4) imidazole compounds has excellent workability, reliability and cost as the interlayer insulating material.

Specific examples of the epoxy resin (B-1) include a bisphenol A type epoxy resin, a bisphenol F type epoxy resin, a bisphenol S type epoxy resin, a phenol novolac type epoxy resin, an alkylphenol novolac type epoxy resin, a biphenol type epoxy resin, a naphthalene type epoxy resin, a dicyclopentadiene type epoxy resin, an epoxidation product of a condensate of phenols and an aromatic aldehyde having a phenolic hydroxyl group, or known conventional epoxy resins such as a bromine atom-containing epoxy resin and a phosphor atom-containing epoxy resin thereof, triglycidyl-isocyanurate and an alicyclic epoxy resin, and they can be used individually or in combination. A mono-functional epoxy resin as a reactive diluent may be contained.

In the present invention, it is preferable to use an epoxy resin in which a compound having the epoxy equivalent of 200 or less and a compound having the epoxy equivalent exceeding 200 are mixed at an arbitrary rate, and more specifically, an epoxy resin in which a compound having the epoxy equivalent of 100 to 200 and a compound having the epoxy equivalent of 250 to 3,000 are mixed at an arbitrary rate. The epoxy resin in which the epoxy equivalent exceeds 200 has little curing contraction, and applies the prevention of warp of the substrate and the flexibility of the cured product. Fusion viscosity at the time of heating lamination and leveling can be increased, and it is effective for controlling a resin staining amount after molding. On the other hand, the epoxy resin having the epoxy equivalent of 200 or less has high reactivity, and applies the mechanical strength to the cured product. Since the fusion viscosity at the time of the heating lamination is low, the epoxy resin contributes to the filling ability of the resin composition to a clearance between inner layer circuits and the follow ability to the uneven roughened surface of the copper foil.

The polyimide resin (B-2) causes the following important effects for the thermosetting resin composition of the present invention. That is, the imide skeleton realizes high heat resistance and high Tg. Since the polyimide resin has a carboxyl group, the polyimide resin can be reacted with the epoxy resin, and the adhesiveness, electrical property, workability and low temperature curability which are the features of the epoxy resin that can be realized. Further, since the polyimide resin has a linear hydrocarbon structure partially, the surface of the insulating layer-can be selectively roughened by a commercially available desmear liquid, and unevenness is formed on the surface of the curing coat to express the adhesion due to a strong anchor effect with a copper plating layer. Moreover, the polyimide resin has a nitrogen-containing heterocyclic structure, and therefore, the polyimide resin has an effect on fire retardancy.

Also, the polyimide resin has an effect on the low water absorption, the low dielectric constant and the low dielectric dissipation factor by the linear hydrocarbon structure and the imide skeleton. When the polyimide resin contains an isocyanurate ring particularly, the polyimide resin is different from a usual polyimide having a line structure, and becomes, what is called, a polymer having hyperbranched type polymer structure. As a consequence, the polyimide resin can be arbitrarily dissolved in the epoxy resin and the solvent in spite of the polyimide resin being the polymer. The workability thereof is the same as that of a low molecular compound or an oligomer, and has characteristics as a polymer material.

Preferably, the specific polyimide resin (B-2) may be a polyimide resin having a carboxyl group and a linear hydrocarbon structure having a number-average molecular weight of 300 to 6000. Of these, a polyimide resin (B-2) having a carboxyl group, a linear hydrocarbon structure having a number-average molecular weight of 700 to 4500, an urethane bond, an imide ring, an isocyanurate ring and a cyclic aliphatic structure is preferable since the polyimide resin (B-2) has excellent solubility with non-proton system polarity organic solvents such as a common solvent, for example, a ketone system solvent, an ester system solvent and an ether system solvent, and excellent heat resistance. It is particularly preferable that the linear hydrocarbon structure has the number-average molecular weight of 800 to 4200 since the polyimide resin having good balance of the flexibility and dielectric property of the cured product is obtained.

Examples of the polyimide resin (B-2) include a polyimide resin (B-2) which has a structure unit represented by the following general formula (1) and a structure unit represented by the following general formula (2) and which has at least one kind of terminal structures represented by the following general formulae (3), (4) and (5). Of these, more preferable is a polyimide resin which contains 20 to 40 mass % of a linear hydrocarbon structure having an acid value of 20 to 250 mgKOH/g and a number-average molecular weight of 300 to 6000, and which has a concentration of an isocyanurate ring of 0.3 to 1.2 mmol/g, a number-average molecular weight of 2,000 to 30,000 and a weight average molecular weight of 3,000 to 100,000:

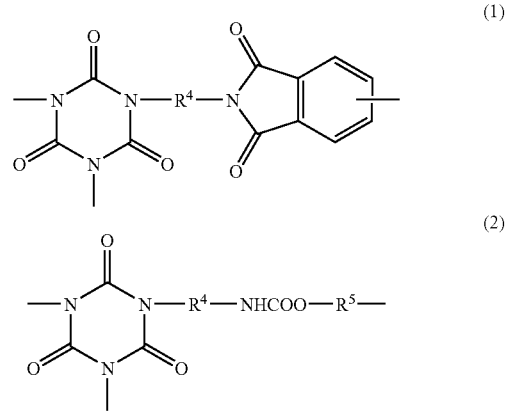

wherein $R^4$ represents an organic group having a cyclic aliphatic structure having 6 to 13 carbon atoms, and $R^5$ represents a linear hydrocarbon structure having a number-average molecular weight of 300 to 6000, and particularly preferably 800 to 4200.

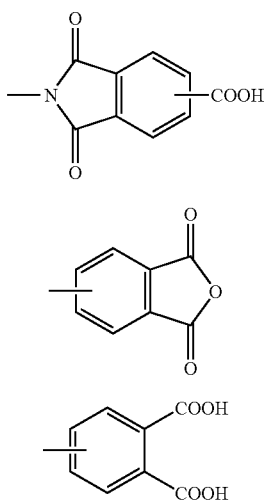

In the present invention, the acid value of the polyimide resin (B-2), the concentration, number-average molecular weight and weight average molecular weight of the isocyanurate ring are measured by the following method.

(1) Acid Value: The acid value is measured according to JIS K-5601-2-1. As a dilution solvent for a sample, a mixed solvent of acetone/water (9/1 volume ratio) having an acid value of zero mgKOH/g is used so that the acid value of an anhydrous acid can also be measured.

(2) Concentration of Isocyanurate Ring: $^{13}$C-NMR analysis [solvent: Deuteration dimethyl sulfoxide (DMSO-$d_6$)] is carried out, and the concentration (mmol) of an isocyanurate ring per gram of a polyimide resin (B-2) is calculated by using an analytical curve from the spectral intensity of a carbon atom caused by the isocyanurate ring at 149 ppm. The concentration of an imide ring can be also similarly calculated by $^{13}$C-NMR analysis from the spectral intensity of a carbon atom caused by the imide ring at 169 ppm.

(3) Number-Average Molecular Weight and Weight Average Molecular Weight: The number-average molecular weight and the weight average molecular weight of polystyrene conversion are calculated by gel permination chromatography (GPC).

The content of the linear hydrocarbon structure in the polyimide resin (B-2) can be calculated from the use mass rate of the polyol compound (a2) in synthetic materials when the polyimide resin (B-2) is prepared by a preparing method to be described later. The number-average molecular weight of the linear hydrocarbon structure can be calculated from the number-average molecular weight of the polyol compound (a2).

The content and the number-average molecular weight of the linear hydrocarbon structure in the polyimide resin prepared by an unknown preparing method can be calculated as follows. That is, the polyimide resin is subjected to a usual hydrolyzing method, for example, heat-treating in the presence of an organic amine to decompose a urethane bond and separate the linear hydrocarbon structure portion from the polyimide resin. Then, by making use of the low polarity of the linear hydrocarbon structure portion as compared with the imide structure portion, the linear hydrocarbon structure portion is extracted by using a low polarity organic solvent such as dichloromethane to perform the measurement of the amount of extraction and GPC analysis.

The method of preparing the polyimide resin (B-2) to be used for the thermosetting resin composition of the invention is not particularly limited. A preferable example thereof is a method for reacting a polycarboxylic anhydride (BB) having at least three carboxyl groups with a prepolymer (A1) having an isocyanate group at an end obtained by reacting the polyisocyanate compound (a1) with the polyol compound (a2) having a linear hydrocarbon structure and having the number-average molecular weight of the linear hydrocarbon structure portion of 300 to 6000 in an organic solvent.

For example, in order to prepare the polyimide resin (B-2) by the above preparing method, the tricarboxylic anhydride may be reacted in the organic solvent with the prepolymer having the isocyanate group at an end obtained by reacting the polyisocyanate having the isocyanurate ring derived from the diisocyanate having the cyclic aliphatic structure having 6 to 13 carbon atoms with the polyol compound having the linear hydrocarbon structure and having the number-average molecular weight of the linear hydrocarbon structure portion of 300 to 6000.

The polyisocyanate compound (a1) for use in the preparing method has at least two isocyanate groups in the molecule. Examples thereof include an aromatic polyisocyanate and an aliphatic polyisocyanate (containing a cyclic aliphatic polyisocyanate); and the nutate body, bullet body, adduct body and alohanate body of the polyisocyanates thereof.

Examples of the aromatic polyisocyanate compound include p-phenylene diisocyanate, m-phenylene diisocyanate, p-xylene diisocyanate, m-xylene diisocyanate, 2,4-tolylene diisocyanate, 2,6-tolylene diisocyanate, 4,4'-diphenylmethane diisocyanate, polymethylene polyphenyl polyisocyanate (Crude MDI), 3,3'-dimethyldiphenyl-4,4'-diisocyanate, 3,3'-diethyldiphenyl-4,4'-diisocyanate, 1,3-bis (α,α-dimethylisocyanatemethyl)benzene, tetramethylxylylenediisocyanate, diphenyleneether-4,4'-diisocyanate, and naphthalene diisocyanate.

Examples of the aliphatic polyisocyanate compound include hexamethylene diisocyanate (HDI), lysine diisocyanate, trimethylhexamethylene methylene diisocyanate, isophorone diisocyanate (IPDI), 4,4'-dicyclohexylmethane diisocyanate, hydrogenated xylene diisocyanate (HXDI), and norbornene diisocyanate (NBDI).

As the polyisocyanate compound (a1), aliphatic polyisocyanate is preferable since the aliphatic polyisocyanate has good organic solvent solubility and compatibility with the epoxy resin or the organic solvent, and the polyimide resin having a low dielectric constant and dielectric dissipation factor of the cured product is obtained. In addition, isocyanurate type polyisocyanate is preferable since the cured product having good heat resistance is obtained.

Furthermore, as the polyisocyanate compound (a1), a polyisocyanate compound (a11) having an isocyanurate ring derived from aliphatic polyisocyanate is more preferable, and a polyisocyanate compound having an isocyanurate ring derived from cyclic aliphatic polyisocyanate is still more preferable since the polyimide resin having good organic solvent solubility and compatibility with the epoxy resin or the organic solvent, the low dielectric constant and dielectric dissipation factor of the cured product, and good heat resistance is obtained. Examples of the polyisocyanate compound having the isocyanurate ring derived from the cyclic aliphatic polyisocyanate include a polyisocyanate compound having 2 to 3 moles times of the cyclic aliphatic structure to 1 mol of the isocyanurate ring. A polyisocyanate compound having 2.5 to 3 moles times of the cyclic aliphatic structure is more preferable.

Include a polyisocyanate compound obtained by isocyanurating one kind or two kinds or more of the aliphatic diisocyanate compounds in the present or absence of an isocyanurating catalyst such as a quarternary ammonium salt and consisting of the mixture of the isocyanurates such as a trimer, a pentamer and a heptamer. Specific examples of the polyisocyanate compound (a11) include isocyanurate type polyisocyanate (IPDI3N) of isophorone diisocyanate, isocyanurate type polyisocyanate (HDI3N) of hexamethylene diisocyanate, isocyanurate type polyisocyanate (HXDI3N) of hydrogenated xylene diisocyanate, and isocyanurate type polyisocyanate (NBDI3N) of norbornane diisocyanate.

As the polyisocyanate compound (a11), a polyisocyanate compound (a11) containing the isocyanurate of the trimer of 30 mass parts or more in 100 mass parts of the polyisocyanate compound (a1) is preferable, and a polyisocyanate compound containing the isocyanurate of 50 mass parts or more is particularly preferable since the polyimide resin having good organic solvent solubility and heat resistance of the cured product is obtained.

As the polyisocyanate compound (a11), the content of the isocyanate group of 10 to 30 mass % is also more preferable since the polyimide resin having good organic solvent solubility and heat resistance of the cured product is obtained. Therefore, as the polyisocyanate compound (a11), a polyisocyanate compound having an isocyanurate ring derived from cyclic aliphatic polyisocyanate and having 10 to 30 mass % of the content of the isocyanate group is the most preferable.

Although the polyisocyanate having the isocyanurate ring may be used together with other polyisocyanate, the isocyanurate type polyisocyanate is preferably used individually.

The polyol compound (a2) for use in the above preparing method must be a polyol compound of which the number-average molecular weight of the linear hydrocarbon structure portion is 300 to 6,000. Of these, a polyol compound of which the number-average molecular weight of the linear hydrocarbon structure portion is 700 to 4500 is preferable, and a polyol compound of which the number-average molecular weight of the linear hydrocarbon structure portion is 800 to 4200 is preferable since the polyimide resin having good organic solvent solubility and compatibility with the epoxy resin or the organic solvent, low dielectric constant and dielectric dissipation factor of the cured product, and excellent film forming is obtained. A polyol compound of which the number-average molecular weight of the linear hydrocarbon structure portion is less than 300 is not preferable since the dielectric constant and dielectric dissipation factor of the cured product are high. A polyol compound of which the number-average molecular weight of the linear hydrocarbon structure portion exceeds 6,000 is not preferable since the organic solvent solubility, compatibility with the epoxy resin or the organic solvent, and mechanical physical properties of the polyol compound are poor.

Examples of the polyol compound (a2) include a compound having hydroxyl groups of 1.5 or more on average per molecule in total, bonded with the end and/or side chain of the linear hydrocarbon structure. The linear hydrocarbon structure may be a straight- or branched-chain. Although the linear hydrocarbon structure may have a saturated hydrocarbon chain or an unsaturated hydrocarbon chain, the saturated hydrocarbon chain is more preferable in view of the physical properties change and stability at the time of heating.

Examples of the polyol compound (a2) include a polyol compound having a polyolefin structure or a polydiene structure and having the number-average molecular weight of 300 to 6,000, and a hydrogenated product thereof. Examples of the olefin include ethylene, propylene, butene, isbutylene, pentenee and methylpentene. Examples of the diene include pentadiene, hexadiene, isoprene, butadiene, propadiene and dimethyl butadiene.

Specific examples of the polyol compound (a2) include polyol compounds of which the number-average molecular weight of a linear hydrocarbon structure portion is 300 to 6000 such as polyethylene system polyols, polypropylene system polyols, polybutadiene polyols, hydrogenated polybutadiene polyols, polyisoprene polyols and hydrogenated polyisoprene polyols. These may be used individually or in combination.

The average of the number of the hydroxyl groups of the polyol compound (a2) is preferably 1.5 to 3 since a polyimide resin which hardly gels and which has good molecule growth and excellent flexibility is obtained. The average of the number of hydroxyl groups is particularly preferably 1.8 to 2.2.

Examples of the commercial items of the polyol compound (a2) include liquid polybutadiene having hydroxyl groups at both the ends, such as NISSO PB (G series) manufactured by Nippon Soda Co., Ltd. and Poly-bd manufactured by Idemitsu Petrochemistry; hydrogenated poly butadiene having hydroxyl groups at both the ends, such as NISSO PB (GI series) manufactured by Nippon Soda Co., Ltd. and Polytail H and Polytail HA manufactured by Mitsubishi Chemical Corporation; a liquefied C5 system polymer having hydroxyl groups at both the ends, such as Poly-iP manufactured by Idemitsu Petrochemistry; hydrogenated polyisoprene having hydroxyl groups at both the ends, such as Epol manufactured by Idemitsu Petrochemistry, and TH-1, TH-2 and TH-3 manufactured by Kuraray Co., Ltd.

Further, as the polyol compound (a2), an ester denaturated polyol compound and urethane denaturated polyol compound obtained by reacting the polyol compound having the linear hydrocarbon structure described above with various polybasic acids or the polyisocyanate can be also used.

As the polyol compound (a2), polybutadiene polyol and/or a hydrogenated polybutadiene polyol are preferable, and in particular, the hydrogenated polybutadiene polyol is more preferable.

In the polyimide resin (B-2), the linear hydrocarbon structure derived from the polyol compound (2a) is introduced between adamant skeletons having an imide binding. Therefore, a high glass transition point is required for particularly excellent heat resistance of such a polyimide resin (B-2). For this reason, it has been presumed that the polyol compound (a2), used for materials, having a high glass transition point is more advantageous. However, as a result of the keen examination, it has become clear that when the glass transition point of the polyol compound (a2) introduced into the molecule of the polyimide resin is lower, a glass transition point of a cured product is higher, and a cured product having more excellent mechanical physical properties is obtained by using a polyol compound having a low glass transition point. The glass transition point of the polyol compound (a2) is preferably −120 to 0° C. from the above evidence.

In the above method of preparing the polyimide resin (B-2), the polyol compound (a2) may be used together with another hydroxyl group-containing compound to the extent that the effects described above are not spoiled. In this case, the other hydroxyl group-containing compound of 50 mass % or less of whole hydroxyl group-containing compound is desirably used.

Examples of the polycarboxylic anhydride (BB) having at least three carboxyl groups, which is used in the above method of preparing the polyimide resin (B-2) include tricarboxylic anhydride and tetracarboxylic anhydride.

Examples of the tricarboxylic anhydride include an anhydrous trimellitic acid and naphthalene-1,2,4-tricarboxylic anhydride.

Examples of the tetracarboxylic anhydride include tetracarboxylic anhydride having an aromatic organic group in the molecule such as pyromellitic dianhydride, benzophenone-3,4,3',4'-tetracarboxylic dianhydride, diphenyl ether-3,4,3',4'-tetracarboxylic dianhydride, benzene-1,2,3,4-tetracarboxylic dianhydride, biphenyl-3,4,3'-4'-tetracarboxylic dianhydride, biphenyl-2,3,2',3'-tetracarboxylic dianhydride, naphthalene-2,3,6,7-tetracarboxylic dianhydride, naphthalene-1,2,4,5-tetracarboxylic dianhydride, naphthalene-1,8,4,5-tetracarboxylic dianhydride, decahydronaphthalene-1,8,4,5-tetracarboxylic dianhydride, 4,8-dimethyl-1,2,3,5,6,7-hexahydronaphthalene-1,2,5,6-tetracarboxylic dianhydride, 2,6-dichloronaphthalene-1,8,4,5-tetracarboxylic dianhydride, 2,7-dichloronaphthalene-1,8,4,5-tetracarboxylic dianhydride, 2,3,6,7-tetrachloronaphthalene-1,8,4,5-tetracarboxylic dianhydride, phenanthrene-1,2,9,10-tetracarboxylic dianhydride, peryllene-3,4,9,10-tetracarboxylic dianhydride, bis(2,3-dicarboxyphenyl)methane dianhydride, bis(3,4-dicarboxyphenyl)methane dianhydride, 1,1-bis(2,3-dicarboxyphenyl)ethane dianhydride, 1,1-bis(3,4-dicarboxyphenyl)ethane dianhydride, 2,2-bis(2,3-dicarboxyphenyl)propane dianhydride, 2,3-bis(3,4-dicarboxyphenyl)propane dianhydride, bis(3,4-dicarboxyphenyl)sulfone dianhydride, and bis(3,4-dicarboxyphenyl)ether dianhydride. A plurality thereof may be used in combination. The tricarboxylic anhydride and the tetracarboxylic anhydride may be mixed and used.

The acid value of the polyimide resin (B-2) constituting the thermosetting resin composition of the present invention is preferably 20 to 250 mgKOH/g at solid conversion, and more preferably 20 to 150 mgKOH/g in order to enhance the organic solvent solubility and the curing physical properties. It is preferable that, with respect to the molecular weight of the polyimide resin, the number-average molecular weight is 2,000 to 30,000 and the weight average molecular weight is 3,000 to 100,000 in order to enhance the solvent solubility. It is more preferable that the number-average molecular weight is 2,000 to 10,000 and the weight average molecular weight is 3,000 to 50,000.

The phenol resin (B-3) can be used in order to enhance the mechanical strength and heat resistance of the cured product. As the phenol resin (B-3), there can be used known conventional phenol resins (B-3) such as a phenol novolac resin, an alkylphenol novolac resin, a bisphenol A novolac resin, a dicyclopentadiene type phenol resin, an Xylok type phenol resin, a terpene-modified phenol resin and polyvinylphenols individually or in combination.

With respect to the addition amount, the phenol resin is preferably added in the range of 0 to 1.2 phenolic hydroxyl group equivalent based on the epoxy resin corresponding to one epoxy equivalent. The heat resistance of the epoxy resin composition to be obtained may be spoiled when the phenol resin content deviates from the range.

The thermosetting resin composition of the present invention described above can further contain a known conventional catalyst type curing agent of the epoxy resin if needed. As the epoxy resin curing agent, known conventional compounds such as organic phosphine system compounds including triphenylphosphine, tetraphenylphosphonium or tetraphenyl borate, DBU or the derivative thereof can be used individually or in combination in addition to a tertiary amine compound, an imidazole compound (B-4), guanidines, or an epoxy adduct and microcapsulated compound thereof.

It is preferable that, of these, the imidazole compound (B-4) is mildly reacted in a temperature region (80 to 130° C.) when drying the solvent in the composition, can be fully reacted in a temperature region (150 to 200° C.) at the time of curing, and fully expresses the physical properties of the cured product. It is also preferable that the imidazole compound has excellent adhesion to a copper circuit and copper foil. Particularly preferable examples include 2-ethyl-4-methyl imidazole, 2-methyl imidazole, 2-phenyl imidazole, 2-phenyl-4-methyl imidazole, bis (2-ethyl-4-methyl-imidazole), 2-phenyl-4-methyl-5-hydroxymethylimidazole, 2-phenyl-4,5-dihydroxymethylimidazole and triazine addition-type imidazole.

The epoxy resin curing agents are preferably added in the range of 0.05 to 20 mass parts based on 100 mass parts of the total amount of the epoxy resin (B-1). When the addition amount is less than 0.05 mass parts, insufficient curing is exhibited. On the other hand, when the addition amount exceeds 20 mass parts, the curing acceleration effect is not increased, and on the contrary, the heat resistance and the mechanical strength are spoiled.

The thermosetting resin composition of the present invention can further contain an inorganic filler for the purpose of enhancing characteristics such as the adhesion, mechanical strength and coefficient of linear expansion of the cured product. For example, there can be used known conventional inorganic fillers such as barium sulfate, barium titanate, silicon oxide powder, fine powder silicon oxide, amorphous silica, talc, clay, magnesium carbonate, calcium carbonate, aluminum oxide, aluminium hydroxide and mica powder. The addition ratio is preferably 0 to 90 mass % based on the total amount of resin composition.

Also, the thermosetting resin composition of the present invention can contain known conventional colorants such as phthalocyanine blue, phthalocyanine green, iodine green, disazo yellow, crystal violet, titanium oxide, carbon black and naphthalene; known conventional thickeners such as asbestos, orben, benton and fine powder silica; antifoaming agents and/or leveling agents such as a silicone system, a fluoride system and a polymer system; adhesion applying agents such as a thiazole system, a triazole system and a silane coupling agent; and known conventional additives such as a titanate system and an aluminum system if necessary.

The configuration of the thermosetting resin composition of the present invention may be provided as a coating material of which the viscosity is moderately adjusted, and the thermosetting resin composition may be applied on a support base film to produce a dry film in which a solvent is dried. Furthermore, there may be provided as a prepreg sheet in which the thermosetting resin composition is impregnated in a base material such as glass cross, glass, and aramid non-woven fabric and is semi-cured.

The coating material, dry film and prepreg using the thermosetting resin composition may be directly coated, dried and cured on the inner layer circuit board having the circuit formed thereon. The films may be heat-laminated to integrally form them, and then, may be cured in an oven or cured by hot plate pressing.

The method of laminating or hot plate pressing in the above process is preferable since the unevenness due to the inner layer circuit is solved when being heated and fused, and is cured as it is, so that a multilayer board having a flat surface state is finally obtained. A substrate having the inner layer circuit formed thereon and a film or prepreg of the thermosetting resin composition can be laminated, or a substrate on which the copper foil or the circuit has been formed can be also simultaneously laminated when hot plate pressing.

A hole is formed in the substrate thus obtained by a semiconductor laser such as $CO_2$ laser and UV-YAG laser, or a drill. This hole may be a through hole for the electrical connection of the obverse and reverse of the substrate, or a partial hole (buried via) for the electrical connection of the inner layer circuit and the circuit formed on the surface of the interlayer insulating material.

was dissolved. Further, Aerosil #972 which is fine powder silica was added, and the mixed components were kneaded and dispersed in three roll mills to obtain a thermosetting resin composition having the viscosity adjusted to 20±10 dPa·S (rotation viscosity meter: 5 rpm, 25° C.).

TABLE 1

|  | Inv. 1 | Inv. 2 | Inv. 3 | Inv. 4 | Comp. 1 | Comp. 2 | Comp. 3 | Comp. 4 | Comp. 5 | Comp. 6 |
|---|---|---|---|---|---|---|---|---|---|---|
| Resin(A-1)*[1] | 30 | 30 | 30 | 30 | — | — | — | — | — | — |
| Resin(C-1)*[2] | — | — | — | — | — | — | 30 | — | — | 30 |
| Resin(C-2)*[3] | — | — | — | — | — | — | — | 30 | — | — |
| Resin(B-1-1)*[4] | 35 | 35 | 35 | 35 | 35 | 35 | 35 | 35 | 35 | 35 |
| Resin(B-1-2)*[5] | 35 | 35 | 35 | 35 | 35 | 35 | 35 | 35 | 35 | 35 |
| Resin(B-2-1)*[6] | — | 6 | — | 6 | — | — | — | — | 6 | 6 |
| Resin(B-3-1)*[7] | 20 | 20 | 20 | 20 | 20 | 20 | 20 | 20 | 20 | 20 |
| Curing catalyst (B-4-1)*[8] | 1 | 1 | 1 | 1 | 1 | 1 | 1 | 1 | 1 | 1 |
| silica*[9] | — | — | 45 | 45 | — | 45 | — | — | — | 45 |

*[1] Acetyl denaturated bisphenol S/bixylenol phenoxy resin RX200 (Dainippon ink and chemicals, incorporated; degree of acetylation 90% or more; Mn = 16,000; Mw = 82,000)
*[2] Bisphenol A phenoxy resin YP-50 (Tohto kasei co., ltd.; Mn = 14,200, Mw = 58,000)
*[3] Bisphenol SI bixylenol phenoxy resin YX8100 (Japan epoxy resins co.,ltd.; Mn= 13,000; Mw = 34,000)
*[4] Epoxy resin HP4032 (Dainippon ink and chemicals, incorporated; epoxy equivalent=140)
*[5] Epoxy resin HP7200 (Dainippon ink and chemicals, incorporated; epoxy equivalent=280)
*[6] Hydrogenated butadiene denaturated terminal carboxyl group hyperbranched type polyimide RS23-306 (Dainippon ink and chemicals, incorporated)
*[7] Phenol resin HF-1 (Meiwa plastic industries ltd.)
*[8] Imidazole 2PHZ (Shikoku chemicals corporation)
*[9] Spheral silica SO-C5 (Admatechs co., ltd.)

After forming the hole, the surface unevenness is simultaneously formed by a commercially available desmear liquid (roughening agent) in order to remove a residue (smear) existing in the inner wall and bottom of the hole, and to express an anchor effect with the conductor (metal plating formed afterward). This process can be also carried out in a dry process such as plasma.

Then, conductor plating is applied on the hole from which the residue has been removed by the desmear liquid and the coat surface in which the unevenness has been formed by the chemicals. Furthermore, the circuit is formed. In any method, a heat treatment referred to as annealing may be applied for about 10 to 60 minutes at about 80 to 180° C. for the purpose of removing metal stress and enhancing the strength after electroless plating, electrolysis plating or both the platings.

As metal plating used herein, copper, tin, solder, nickel or the like can be used without being particularly limited, and a plurality thereof can be used in combination. Metal sputtering or the like can be substituted instead of plating used herein.

Thus, there can be provided the build-up type multilayer printed wiring board having low water absorption, a low dielectric constant and low dielectric dissipation factor, excellent adhesion to the substrate and the conductor, and high reliability.

EXAMPLES

Hereinafter, with reference to examples, the present invention will be specifically described. However, the present invention is not limited to the following Examples. Unless otherwise noted, all the terms "part" and "%" are represented by a mass basis.

<Inventions 1 to 4 and Comparatives 1 to 6>

Propyleneglycol monomethyl ether acetate as an organic solvent was added to mixed components of Inventions 1 to 4 and Comparatives 1 to 6 shown in the following Table 1 and <Production of Adhesion Films>

Thermosetting resin compositions obtained by mixing components as shown in Table 1 were respectively applied onto a PET film (Rumirror 38R75: 38 μm, manufactured by Toray Industries, Inc.) by using a bar coater such that the film thickness of a film was set to 40 μm after drying, and were dried at 40 to 120° C. to obtain adhesion films.

Examination Example 1

Next, the adhesion film was heated and laminated on a copper foil of 35 μm under the conditions of 0.49 MPa, 120° C., 1 minute and 133.3 Pa by using a vacuum laminator (MVLP-500, manufactured by MEIKI). After leveling under the conditions of 0.98 MPa, 130° C. and 1 minute by using a hot plate pressing machine, the adhesion film was cured under the conditions of 150° C.×60 minutes and further 170° C.×30 minutes in a hot air circulating type oven. The copper foil as the obtained sample was etched by a commercially available etchant to evaluate the physical properties of the cured coat. The results are shown in Table 2.

Examination Example 2

An inner layer circuit was formed from a glass epoxy double-sided copper-clad laminate having a thickness of the copper foil of 18 μm. Further, the adhesion film produced in "Production of adhesion films" was heated and laminated on both sides of a substrate subjected to etch bond (manufactured by Moeck) treatment under the conditions of 0.49 MPa, 120° C., 1 minute and 133.3 Pa by using a vacuum laminator (MVLP-500, manufactured by Meiki). After leveling by using the hot plate pressing machine under the conditions of 0.98 MPa, 130° C. and 1 minute, the adhesion film was cured under the condition of 150° C.×60 minutes in the hot air circulating type dryer to produce a laminate.

Furthermore, a hole was formed in a predetermined through hole part, via hole part and the like of the laminate by a drill and laser. Desmear treatment and the uneven formation of the surface were then carried out by using generalized and known chemicals. Then, after carrying out the electrical connection of the whole surface and hole part by electroless copper plating and electrolysis copper plating, heat treatment was applied at 170° C. for 30 minutes in order to remove moisture or anneal copper plating. Subsequently, a pattern was formed by etching through commercially available etching resist to produce a multilayer printed wiring board.

The following physical properties and characteristics of the multilayer printed wiring board thus produced were examined and evaluated. The evaluation results are shown in Table 2.

after exceeding the glass transition point (Tg) were measured by TMA. Units in Table 2 are ppm.

(c) Dielectric Constant Dk and Dielectric Dissipation Factor Df:

The dielectric constant and dielectric dissipation factor of the cured film were measured by using a cavity resonator perturbation method dielectric constant measurement device manufactured by Kanto Electronic Application Development Company.

(d) Solder Heat Resistance:

The completed printed wiring board (10 cm×10 cm) was immersed in a solder layer of 288±3° C. for 10 seconds. After repeating this operation, the number of times of a repetition

TABLE 2

|  |  | Inv. 1 | Inv. 2 | Inv. 3 | Inv. 4 | Comp. 1 | Comp. 2 | Comp. 3 | Comp. 4 | Comp. 5 | Comp. 6 |
| --- | --- | --- | --- | --- | --- | --- | --- | --- | --- | --- | --- |
| Tg (° C.) |  | 137 | 142 | 153 | 145 | 148 | 153 | 135 | 138 | 155 | 148 |
| CTE (<Tg) |  | 70 | 69 | 64 | 64 | 62 | 59 | 70 | 68 | 61 | 65 |
| CTE (>Tg) |  | 160 | 158 | 135 | 137 | 142 | 125 | 160 | 157 | 142 | 135 |
| Dielectric | 1 GHz | 3 | 3 | 2.9 | 2.9 | 3.2 | 3.1 | 3.2 | 3.2 | 3 | 3 |
| constant | 3 GHz | 3 | 2.9 | 2.9 | 2.8 | 3.2 | 3 | 3.2 | 3.1 | 3 | 2.9 |
|  | 5 GHz | 2.9 | 2.9 | 2.8 | 2.7 | 3.1 | 2.9 | 3.1 | 3.1 | 3 | 2.9 |
|  | 10 GHz | 2.9 | 2.8 | 2.7 | 2.7 | 2.9 | 2.8 | 3 | 3 | 2.9 | 2.8 |
| Dielectric | 1 GHz | 0.022 | 0.021 | 0.018 | 0.018 | 0.025 | 0.021 | 0.031 | 0.03 | 0.024 | 0.028 |
| dissipation | 3 GHz | 0.022 | 0.022 | 0.02 | 0.019 | 0.027 | 0.023 | 0.039 | 0.038 | 0.026 | 0.033 |
| factor | 5 GHz | 0.023 | 0.023 | 0.02 | 0.02 | 0.027 | 0.024 | 0.046 | 0.049 | 0.027 | 0.039 |
|  | 10 GHz | 0.024 | 0.024 | 0.021 | 0.02 | 0.03 | 0.026 | 0.052 | 0.053 | 0.029 | 0.045 |
| Solder heat resistance (times) |  | 4 | 5 | 4 | 5 | NG | NG | NG | NG | 2 | 2 |
| Peel strength (N/cm) |  | 8 | 9.2 | 7.8 | 9 | 2.8 | 3.8 | 4.7 | 4.8 | 7.2 | 7.1 |
| Resin staining amount (mm) |  | 4 | 3 | 2 | 3 | NG | NG | 4 | 3 | NG | 3 |

The results of the above Table 2 showed that although there was no difference between the compositions with respect to the frequency dependability of the dielectric constant, there was a difference between the compositions with respect to the frequency dependability of the dielectric dissipation factor. That is, Comparatives 3, 4 and 6 showed that the dielectric dissipation factor was increased in the high frequency area by the addition of the thermoplastic resin. Herein, although Inventions used the thermoplastic resin, the stabilized results were obtained.

The peel strength as the index of the adhesion was remarkably increased in Inventions 1 to 4, and similarly, the same results as those of the peel strength were obtained also in solder heat resistance.

Furthermore, it is found that, with respect to the resin staining, the staining amount is reduced in a system to which the thermoplastic resin of the amount of polymer is added.

Each of the physical properties and characteristics of the above Table 2 was measured and evaluated as follows.

Performance Evaluation (a) Glass Transition Temperature Tg:

The glass transition temperature Tg was measured by thermomechanica analysis (TMA).

(b) Coefficient of Thermal Expansion CTE:

The coefficient of thermal expansion of less than the glass transition point (Tg) and the coefficient of thermal expansion until the generation of peeling of the copper foil was confirmed was measured. The meaning of the symbols in Table 2 is as follows.

NG: Peeling was confirmed once.

(e) Peel Strength:

A pattern for peel strength measurement of copper solid of the multilayer printed wiring board obtained in Examination Example 2 was removed to a width of 1 cm, and the peel strength (N/cm) was measured based on JIS C6481.

(f) Resin Staining Amount:

When films are laminated, the films are previously cut to 9.5 cm×9.5 cm, arranged at the center of a base material of 10 cm×10 cm, and laminated. The resin was cured after the lamination to measure the length (increase) of one side increased by flowing out than the size of the former film. The meaning of the symbols in Table 2 is as follows.

NG: A staining amount is too large to be measured (5 mm or more).

What is claimed is:

1. A thermosetting resin composition comprising:
    (A) a thermoplastic resin; and
    (B) a thermosetting resin,
    wherein the thermoplastic resin has a structure represented by the following general formula (a) and/or a structure represented by the following general formula (b) in which 5 to 99 mol % of hydroxyl groups of polyhydroxyether are esterified,

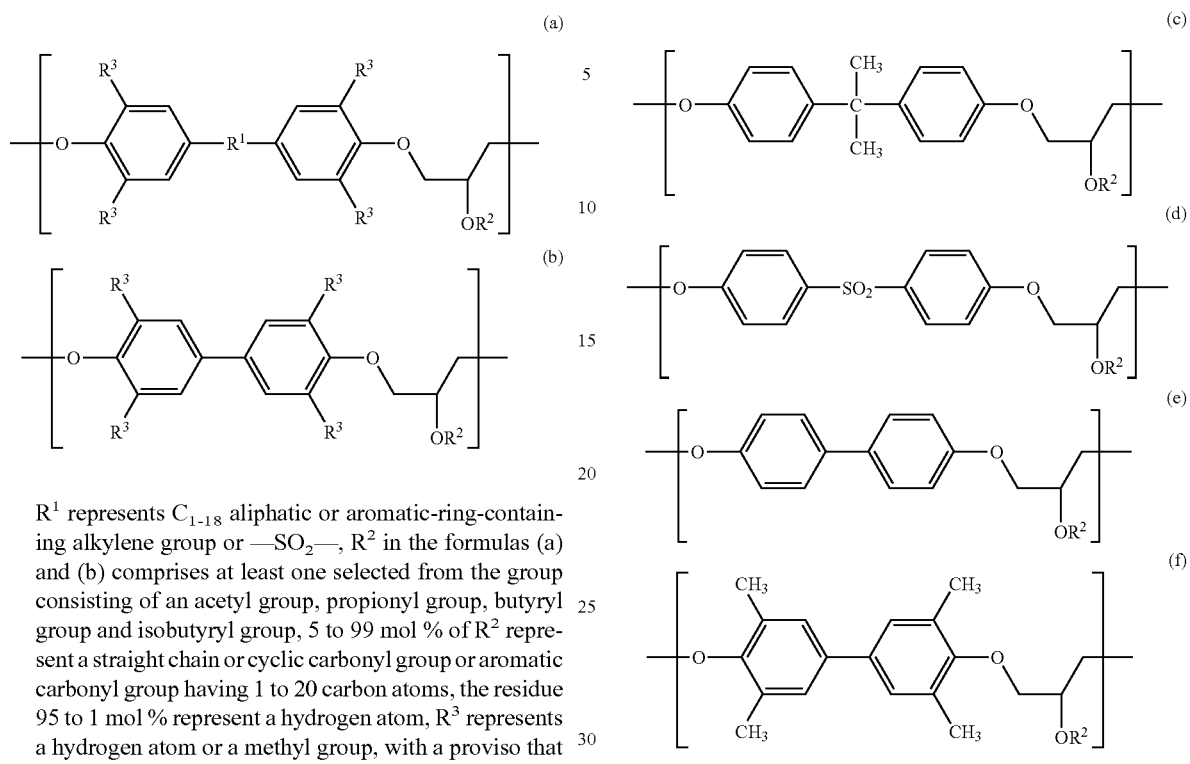

$R^1$ represents $C_{1-18}$ aliphatic or aromatic-ring-containing alkylene group or $-SO_2-$, $R^2$ in the formulas (a) and (b) comprises at least one selected from the group consisting of an acetyl group, propionyl group, butyryl group and isobutyryl group, 5 to 99 mol % of $R^2$ represent a straight chain or cyclic carbonyl group or aromatic carbonyl group having 1 to 20 carbon atoms, the residue 95 to 1 mol % represent a hydrogen atom, $R^3$ represents a hydrogen atom or a methyl group, with a proviso that a plurality of $R^3$'s is the same or different, said thermosetting resin contains (B-1) an epoxy resin having at least two epoxy groups in one molecule, and at least one epoxy curing agent selected from the group consisting of (B-2) a polyimide resin having a carboxyl group and a linear hydrocarbon structure having a number-average molecular weight of 300 to 6000, (B-3) a polyphenol resin having at least two phenolic hydroxyl groups, and (B-4) imidazole compounds.

2. The thermosetting resin composition according to claim 1, wherein said thermoplastic resin (A) has at least one structure selected from the group consisting of a bisphenol A structure represented by the following general formula (c), a bisphenol S structure represented by the following general formula (d), a biphenol structure represented by the following general formula (e), and a bixylenol structure represented by the following general formula (f):

wherein $R^2$ is as defined in claim 1.

3. The thermosetting resin composition according to claim 1, wherein said epoxy resin (B-1) contains a compound having an epoxy equivalent of 200 or less and a compound having an epoxy equivalent exceeding 200.

4. The thermosetting resin composition according to claim 1, wherein said polyimide resin (B-2) has an isocyanurate ring structure.

5. The thermosetting resin composition according to claim 1, further comprising an inorganic filler.

6. A prepreg sheet formed by impregnating a substrate with the thermosetting resin composition according to claim 1, and semi-curing.

7. A build-up type multilayer printed wiring board having an insulating layer formed from the thermosetting resin composition according to claim 1.

* * * * *